United States Patent [19]

Nath et al.

[11] Patent Number: 4,462,333

[45] Date of Patent: Jul. 31, 1984

[54] PROCESS GAS INTRODUCTION, CONFINEMENT AND EVACUATION SYSTEM FOR GLOW DISCHARGE DEPOSITION APPARATUS

[75] Inventors: Prem Nath, Rochester; Kevin R. Hoffman, Sterling Heights; Timothy D. Laarman, Almont, all of Mich.

[73] Assignee: Energy Conversion Devices, Inc., Troy, Mich.

[21] Appl. No.: 437,075

[22] Filed: Oct. 27, 1982

[51] Int. Cl.³ .............................................. C23C 13/10
[52] U.S. Cl. ................................... 118/723; 118/718; 427/39
[58] Field of Search ................. 427/39; 118/50.1, 723, 118/718, 722, 729

[56] References Cited

U.S. PATENT DOCUMENTS 4,269,137  5/1981  Johnson ............................. 118/50.1
4,369,730  1/1983  Izu et al. ............................. 118/723

OTHER PUBLICATIONS

Viva, "Obtaining Improved Gas Flow In Diffusion Apparatus", IBM Tech. Disclosure Bulletin, vol. 14, No. 9, Feb. 1972, p. 2550.

Primary Examiner—John D. Smith
Assistant Examiner—Bernard F. Plantz
Attorney, Agent, or Firm—Marvin S. Siskind

[57] ABSTRACT

A system for introducing, confining and evacuating process gases adjacent the cathode region of glow discharge deposition apparatus, said apparatus adapted to deposit at least one layer of semiconductor material onto a substrate. The deposition apparatus includes at least one dedicated deposition chamber into which process gases are introduced for glow discharge disassociation into species. The system of the present invention includes a baffling manifold adjacent the cathode, said manifold adapted to substantially reduce areas of localized rarification and compression of process gases flowing through the plasma region for substantially preventing adjacent stagnant and rapidly moving areas of process gases from forming nonuniform flow patterns as the semiconductor layer is deposited on the surface of the substrate. The system is also adapted to expose the entire transverse width of the substrate for the deposition of semiconductor material thereunto.

5 Claims, 3 Drawing Figures

PROCESS GAS INTRODUCTION, CONFINEMENT AND EVACUATION SYSTEM FOR GLOW DISCHARGE DEPOSITION APPARATUS

FIELD OF THE INVENTION

This invention relates generally to apparatus for producing improved photovoltaic devices an more particularly to a process gas introduction, confinement and evacuation system for substantially reducing flow pattern formation as semiconductor layers are deposited onto a substrate and exposing the entire transverse width of the substrate for deposition of semiconductor material thereonto.

BACKGROUND OF THE INVENTION

This invention relates to apparatus for continuously producing photovoltaic devices by depositing successive layers of semiconductor material onto a substrate as that substrate travels through operatively connected, dedicated deposition chambers, the composition of the semiconductor layers being dependent upon, inter alia, the particular process gases introduced into each of the deposition chambers. The deposition chambers are connected by a relatively narrow gas gate passageway through which the substrate material passes and which is adapted to isolate the process gases introduced into the first chamber from the process gases introduced into the adjacent deposition chamber. Despite the relatively small size of the gas gate passageways, a percentage of gases introduced into one chamber still back diffuses into the adjacent chamber, thereby contaminating the layer deposited in said adjacent chamber. In an effort to reduce the flow of reacted process gases into adjacent chambers, deposition apparatus constructed by the assignee of the instant application have incorporated shields which at least partially surround the cathode region and which cooperate with introduction and evacuation conduits to inhibit the free flow of process gases from the cathode region. The process gases introduced into the cathode region are therefore directed to flow across the substrate for disassociation into plasma and subsequent deposition thereonto. However, the process gases, so introduced have been found to form flow patterns as they are deposited as semiconductor layers onto the surface of the substrate, thereby reducing the efficiency of photovoltaic devices produced therefrom. The flow pattern formation is due to the fact that certain regions of process gases flowing through the plasma region remain substantially stagnant while adjacent regions of process gases move very quickly therethrough. Since the rate of deposition onto the surface of the substrate is proportional, all other parameters being constant, to the length of time which the process gases are exposed to the electrodynamic field, any areas of localized rarification and compression cause process gases to remain in the plasma region exposed to the electrodynamic field for varying lengths of time. The result is that the process gases are deposited at different rates. Accordingly, slower moving process gases, exposed to the field for greater lengths of time, deposit film onto the substrate surface at a greater rate than the film deposited by the more rapidly moving process gases. The differences in the rates at which film is deposited onto the substrate forms the aforementioned flow patterns, said flow patterns being readily visible to the naked eye.

Further, in the deposition apparatus constructed by the assignee of this application, although each deposition chamber included a shield to direct the process gases through the plasma region to an evacuation port for withdrawal, the web of substrate was adapted to pass thereabove. Therefore, only the central section of the surface of the substrate was available for depositing semiconductor material thereonto. Accordingly, the prior art shield arrangements failed to make maximum use of the substrate surface area available for the production of semiconductor devices.

The present invention operates to substantially (1) reduce the formation of flow patterns on the layered substrate surface and (2) expose the entire surface of the substrate traveling through the plasma region of a deposition chamber for depositing thereonto semiconductor material.

Recently, considerable efforts have been made to develop systems for depositing amorphous semiconductor alloys, each of which can encompass relatively large areas, and which can be doped to form p-type and n-type materials for the production of p-i-n-type devices which are, in operation, substantially equivalent to their crystalline counterparts.

It is now possible to prepare amorphous silicon alloys by glow discharge techniques which possess (1) acceptable concentrations of localized states in the energy gaps thereof, and (2) high quality electronic properties. Such a technique is fully described in U.S. Pat. No. 4,226,898, entitled Amorphous Semiconductors Equivalent to Crystalline Semiconductors, Stanford R. Ovshinsky and Arun Madan which issued Oct. 7, 1980; and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor layers operates to substantially reduce the density of the localized states therein and facilitates the addition of other alloying materials, such as germanium.

The concept of utilizing multiple cells, the enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tendem cell device has two or more cells with the light directed serially through each cell, with a large band gap material followed by smaller band gap materials to absorb the light passed through the first cell. By substantially matching the generated currents from each cell, the overall open circuit voltages from each cell may be added, thereby making the greatest use of the light energy passing through the semiconductor device.

It is of obvious commercial importance to be able to mass produce photovoltaic devices. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in pending patent applications: Ser. No. 151,301, now U.S. Pat. No. 4,400,409, diled May 19, 1980 for A Method of Making P-Doped Silicon Films and Devices Made Therefrom; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material.

BRIEF SUMMARY OF THE INVENTION

Disclosed herein is a process gas introduction, confinement and evacuation system for glow discharge deposition apparatus. The system includes a baffled manifold adapted to substantially prevent the formation of flow patterns resulting in a nonuniform rate of deposition of semiconductor material onto the surface of a web of substrate material. In the preferred embodiment, the glow discharge deposition apparatus includes at least two isolated deposition chambers operatively connected by a gas gate which is adapted to channel a unidirectional flow of gases from one to the adjacent chamber of each pair of deposition chambers.

The gas gate includes a relatively narrow passageway through which a substrate moves from the first of the adjacent deposition chambers wherein process gases deposit a first amorphous semiconductor layer thereonto, to the second of said deposition chambers wherein a differing set of process gases deposit a second amorphous semiconductor layer atop the first layer. Each of the deposition chambers is provided with a supply conduit adjacent the cathode region thereof for introducing the process gases which will be disassociated and deposited as a semiconductor film onto the substrate. The process gases may be deposited in nonuniform thicknesses onto the substrate surface. The baffled manifold described and claimed herein includes a series of staggered baffle plates about which the process gases circuitously flow prior to entering the cathode region and contacting the electrodynamic field developed between the substrate and the cathode, thereby substantially preventing flow pattern formation. The baffled manifold serves the additional purpose of insuring that the process gases are fully mixed prior to entry into that electrodynamic field.

The confinement system disclosed by the present application is also adapted to make full use of the surface area of the substrate upon which it is possible to deposit semiconductor material. Said system includes spaced, elongated, generally horizontally disposed flanges on opposed sides of the cathode shield. These flanges are spaced apart a distance greater than the width of the substrate so that the substrate may travel therebelow with the edges of the flanges overlaying the sides of the substrate. In this manner, the entire surface of the substrate is exposed for the deposition thereonto of semiconductor material.

DETAILED DESCRIPTION OF THE DRAWINGS

I. The Photovoltaic Cell

Figure 1:
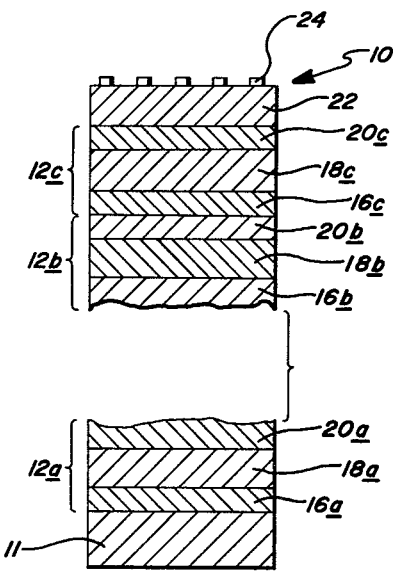
FIG. 1 is a fragmentary, cross-sectional view of a tandem photovoltaic device comprising a plurality of p-i-n type cells, each layer of the cells formed from a semiconductor alloy.

Referring now to the drawings and particularly to FIG. 1, a photovoltaic cell, formed of a plurality of successive p-i-n layers, each of which includes an amorphous semiconductor alloy, is shown generally by the numeral 10. It is for the production of this type of photovoltaic device, wherein amorphous semiconductor layers are continuously deposited onto a moving substrate in successive, isolated deposition chambers, that the process gas introduction, confinement and evacuation system of the present invention was primarily developed.

More particularly, FIG. 1 shows a p-i-n type photovoltaic device such as a solar cell made up of individual p-i-n-type cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to application of the amorphous material, for purposes of this application, the term "substrate" shall include not only a flexible film, but also any elements added thereto by preliminary processing.

Each of the cells 12a, 12b and 12c are fabricated with an amorphous semiconductor body containing at least a silicon alloy. Each of the semiconductor bodies includes an n-type conductivity region or layer 20a, 20b and 20c; an intrinsic region or layer 18a, 18b and 18c; and a p-type conductivity region or layer 16a, 16b, and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the process gas introduction, confinement and evacuation system of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II. The Multiple Glow Discharge Deposition Chambers

Figure 2:
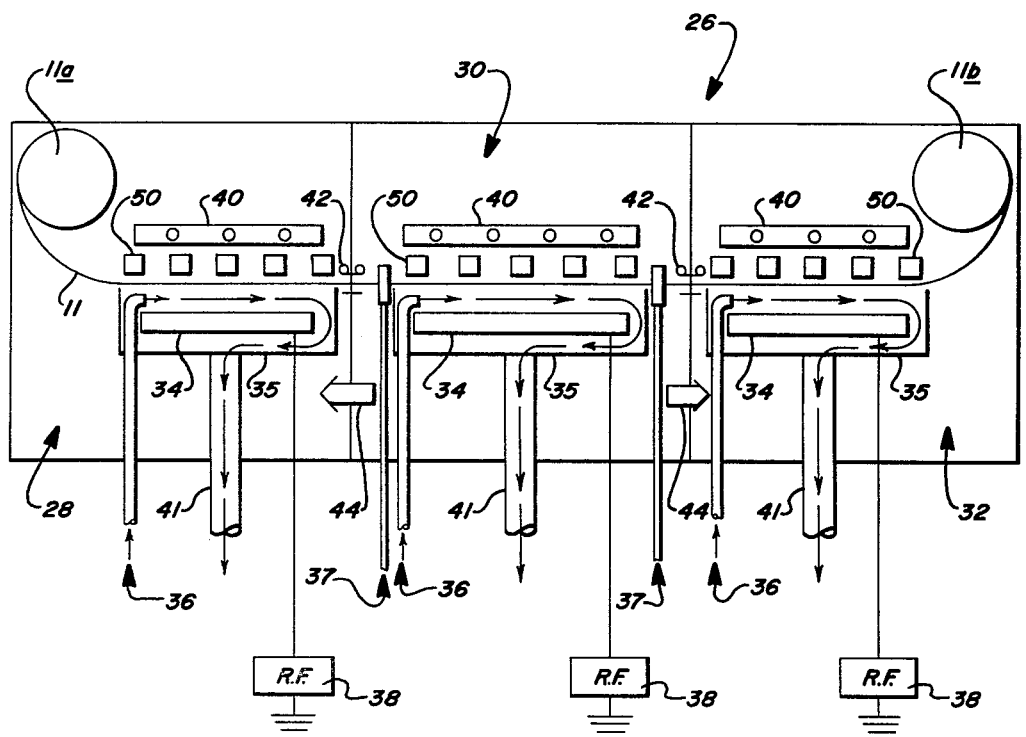
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of a multiple glow discharge chamber deposition apparatus for the continuous production of photovoltaic cells is generally illustrated by the reference numeral 26. It must again be noted that, while continuous deposition apparatus represents only the preferred embodiment of the present invention, the instant confinement system may also be used with batch processing deposition apparatus. The continuous deposition apparatus 26 includes a plurality of isolated, dedicated deposition chambers, each chamber of which is interconnected by a gas gate through which sweep gases and a web of substrate material are adapted to unidirectionally pass.

The apparatus 26 is adapted to mass produce large area, amorphous photovoltaic cells cells having a p-i-n configuration on the deposition surface of a substrate material 11 which is continually fed therethrough. To deposit the amorphous semiconductor layers required for producing multiple p-i-n-type cells, the apparatus 26 includes at least one triad of deposition chambers. Each triad of deposition chamber comprises: a first deposition chamber 28 in which a p-type conductivity amorphous semiconductor layer is deposited onto the deposition surface of the substrate 11 as the substrate 11 passes therethrough; a second deposition chamber 30 in which an intrinsic amorphous semiconductor layer is deposited atop the p-type semiconductor layer on the deposition surface of the substrate 11 as the substrate 11 passes therethrough; and a third deposition chamber 32 in which an n-type conductivity semiconductor layer is deposited atop the intrinsic layer on the deposition surface of the substrate 11 as the substrate 11 passes therethrough. It should be apparent that, (1) although, only one triad of deposition chambers has been illustrated, additional triads or additional individual chambers may be added to the apparatus to provide the machine with the capability of producing photovoltaic cells having any number of amorphous p-i-n-type layers; (2) the process gas introduction, confinement and evacuation system of the present invention is applicable to any machine in which gases are fed into each of a plurality of isolated chambers and those gases must be confined to a specific region with each of those chambers; (3) the substrate supply core 11a and the substrate take-up core 11b are shown in the deposition chambers for illustrative purposes only, while in reality the cores would be housed in separate chambers operatively connected to the deposition chambers; and (4) although the glow discharge process illustrated herein employs an r.f. powered cathode, other glow discharge techniques may be employed without departing from the spirit of the present invention.

Each deposition chamber 28, 30 and 32 of the triad is adapted to deposit a single amorphous silicon alloy layer, by glow discharge deposition onto the substrate 11. To that end, each of the deposition chambers 28, 30 and 32 includes: a cathode 34; a shield 35 disposed about each of the cathodes 34; a process gas supply conduit 36; and inert sweep gas conduit 37 disposed on opposed sides of the intrinsic deposition chamber; a radio frequency generator 38; a process gas and plasma evacuation conduit 41; a plurality of transversely extending magnetic elements 50; a plurality of radiant heating elements shown schematically as 40 in FIG. 2; and a gas gate 42 operatively connecting the intrinsic deposition chamber to each of the dopant chambers.

The supply conduits 36 are operatively associated with the respective cathodes 34 to deliver process gas mixtures to the plasma regions created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The radio frequency generators 38 operate in conjunction with the cathodes 34, the radiant heaters 40 and the grounded substrate 11 to form the plasma by disassociating the reaction gases entering the deposition chambers into deposition chambers into deposition species. The deposition species are then deposited onto the bottom surface of the substrate 11 as amorphous semiconductor layers. The substrate 11, preferably of magnetic material, is maintained substantially flat by the plurality of rows of magnetic elements 50 which provide an attractive force urging the magnetic substrate upwardly, out of its normal sagging path of travel.

To form the photovoltaic cell 10 illustrated in FIG. 1, a p-type amorphous semiconductor layer is deposited onto the substrate 11 in the deposition chamber 28, an intrinsic amorphous semiconductor layer is deposited atop the p-type layer in the deposition chamber 30 and an n-type amorphous semiconductor layer is deposited atop the intrinsic layer in the deposition chamber 32. As a result, the apparatus 26, deposits at least three amorphous semiconductor layers onto the substrate 11 wherein the intrinsic layer deposited in deposition chamber 30 differs in composition from the layers deposited in deposition chambers 28 and 32 by the absence (in quantitatively significant amounts) of at least one element which will be referred to as the dopant or doping species.

It is important that each semiconductor layer deposited onto a surface of the substrate 11, in order to produce high efficiency photovoltaic devices, be of high purity, of homogeneous composition across said substrate surface and of uniform thickness across said substrate surface. In order to achieve these objectives, it is therefore necessary to substantially reduce areas of localized rarification and compression of process gases flowing across the layered surface of the substrate in order to obtain uniform deposition rates. It is further necessary to fully mix the process gases before those gases contact the plasma region in order to deposit a homogeneous film. Finally, it is important that the available surface area of the substrate be fully exploited so as to maximize efficiency of the apparatus.

Figure 3:
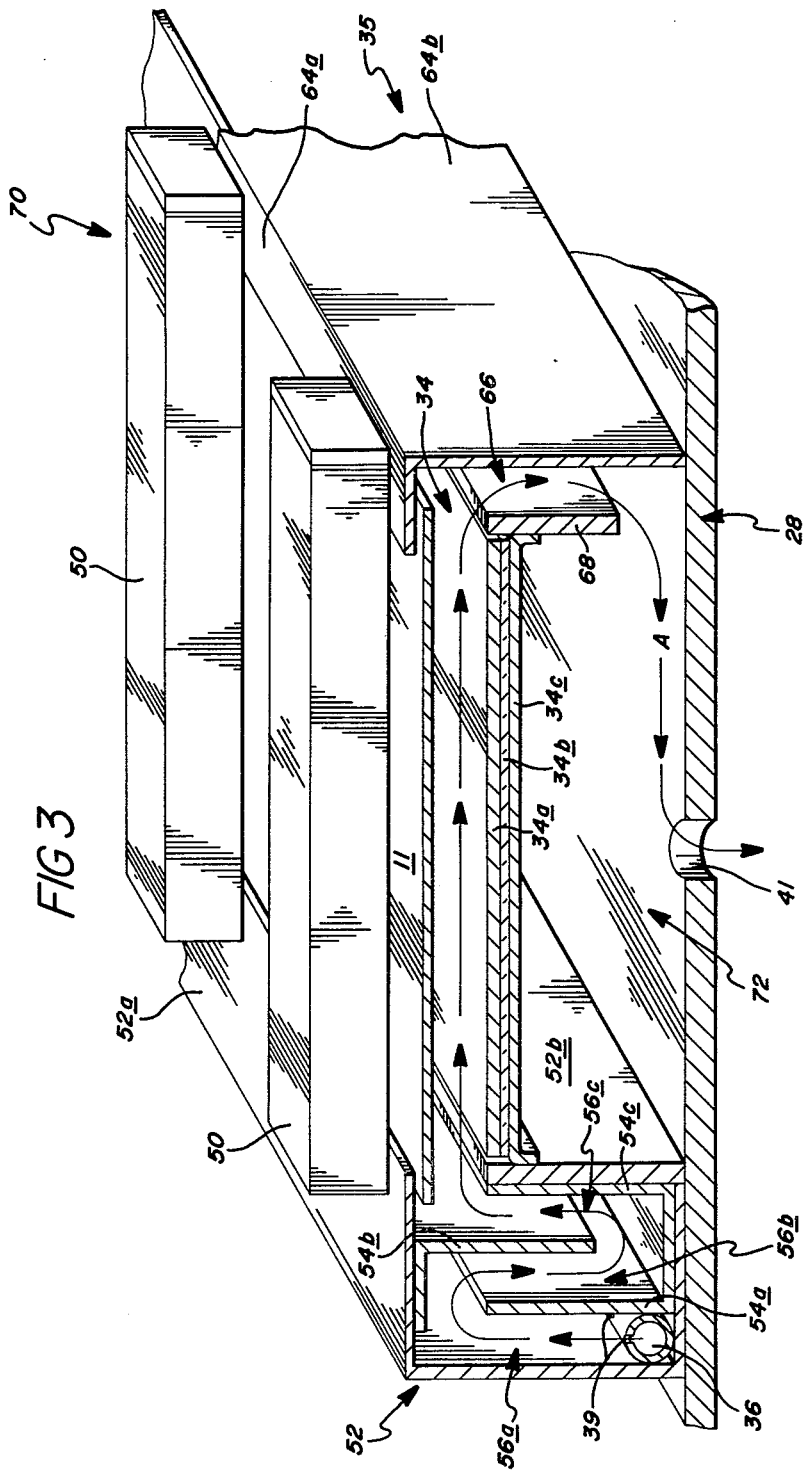
FIG. 3 is an enlarged, fragmentary perspective view of the cathode region of a deposition chamber illustrating the process gas introduction, confinement and evacuation system of the present invention.

III. The process Gas Introduction, Confinement and Evacuation System of the Present Invention Referring now to FIG. 3, the process gas introduction, confinement and evacuation system of the present invention is illustrated generally by the reference numeral 70. As depicted therein, the system 70 is adapted to produce improved photovoltaic cells by (1) preventing the process gases entering the plasma region of a deposition chamber from forming flow patterns as the gases are deposited onto the deposition surface of the substrate 11; (2) fully mixing the process gases in a baffled manifold prior to entry of those gases into the plasma region of the deposition chambers; and (3) exposing substantially the entire transverse width of the substrate for the deposition of semiconductor material thereonto.

As applied herein, the term "cathode region" shall mean that portion of each chamber of the deposition apparatus which is substantially contiguous to the cathode 34. This region shall include the area of the chamber above, below and to either side of said cathode. The term "cathode" shall be applied herein to include the actual cathode plate 34a, the glass insulating sheet 34b upon which the cathode plate 34a rests and the r.f. plate 34c upon which the insulating sheet rests and which is connected to the r.f. power source. Further, the term "plasma region" shall refer to that portion of the cathode region, between the cathode 34 and the substrate 11, in which an electrodynamic field is developed to disassociate the process gas mixture introduced into the cathode region and deposit a semiconductor film onto the exposed surface of the substrate 11.

Process gases, such as silane, silicon-tetraflouride, boron, phosphine, and/or hydrogen are introduced into the deposition chamber through the supply manifold 36 and are directed therefrom to flow through the plasma region for disassociation and deposition. The process gases and plasma are preferably confined to the cathode region by a surrounding cathode shield, generally 35, to insure that unused process gases and nondeposited plasma are removed from the cathode region before those unused gases and nondeposited plasma can migrate from the cathode region toward a gas gate 42 (the migration being due to the pressure differential maintained between adjacent deposition chambers to establish a unidirectional flow of gases through said gas gate). If the gases and plasma are permitted to escape from the cathode region, freely migrate about the interior of the deposition chamber, and contact the chamber walls, they will form silane powder which will then settle between semiconductor layers deposited onto the substrate 11. The unused process gases and nondeposited plasma are confined to the cathode region by the shield 35 substantially surrounding the cathode region. The gases and plasma are directed toward the evacuation conduit 41 disposed at the downstream portion of the cathode region.

Prior deposition systems also introduced gases, such as hydrogen, argon or other inert gas mixtures, at the intrinsic chamber side of the gas gate 42 to reduce the volume of process gases escaping from the cathode region. More particularly, these inert "sweep" gases were directed to flow from the supply conduits 37, disposed on the intrinsic chamber side of the gas gate 42, predominantly through the gas gate passageway 43 to the dopant chamber side of the gas gate. Sufficient quantities (about 250 SCCM) of sweep gas were introduced to insure that about 35 SCCM of the sweep gas flowed into the cathode region of the intrinsic deposition chamber from each of the conduits 37. The sweep gas was drawn, by the pressure differential established between the interior of the deposition chamber and the evacuation conduit 41, into the cathode region from which it exited with the unused process gases and nondeposited plasma via said evacuation conduit. The theory was that the flow of sweep gases into the cathode region would prevent the exodus of process gases and plasma from the cathode region.

The process gas introduction, confinement and evacuation system 70 of the instant application cooperates with the inert gas flow and gas gates to substantially reduce the leakage of unused process gas and nondeposited plasma from the cathode region in substantially the same manner as the prior art shielding arrangements, while, also substantially reducing the formation of flow patterns created by areas of localized rarification and compression of process gases within the plasma region.

Structurally, the system includes a generally elongated, longitudinally extending, horizontally disposed process gas supply conduit 36. The supply conduit 36 is oriented in a plane substantially parallel to the plane of the substrate 11 and is substantially coextensive with the longitudinal length of the cathode 34 (or cathodes, if more than one cathode is used in a chamber). The supply conduit 36 has a plurality of apertures 39 spaced along the length thereof so as to uniformly introduce process gas mixtures into the plasma region of the deposition chamber along the entire length of the cathode.

The apertured supply conduit 36 is housed within a manifold, generally referred to by the reference numeral 52. The manifold 52 is an elongated member of generally rectangular peripheral configuration and is adapted for operative disposition adjacent one of the longitudinal edges of the web of substrate material 11. The length and the positioning of the manifold is such as to uniformly direct process gas mixtures from the apertured supply conduit 36 into the plasma region of the deposition chamber. Accordingly, the manifold 52 is divided into a plurality of interconnected compartments by a plurality of staggered or offset baffle plates 54 which extend across the longitudinal length of the substrate 11. More particularly, the apertured conduit 36 is housed within an elongated baffle chamber 56a so that process gas mixtures expelled therefrom must traverse a circuitous path of travel about baffle plate 54a, through baffle chamber 56b, about baffle plate 54b, through baffle chamber 56c and about baffle plate 54c prior to entering the plasma region, being disassociated by the electrodynamic field and being deposited as semiconductor material onto the surface of the substrate 11. In this manner, the baffled manifold 52 (1) fully mixes the process gases before those gases enter the plasma region, thereby presenting a homogeneous gas mixture of disassociation and deposition and; (2) insures that the flow of process gases across the cathode 34 prevents adjacent pockets of slower and faster moving gases from being deposited onto the substrate surface at different rates, whereby substantially uniform semiconductor layers are deposited. The unused process gases and nondeposited plasma are then withdrawn from the plasma region, about the side of the cathode opposite the side at which the manifold 52 is disposed (arrow A in FIG. 3 indicates the path of travel of the process gases) and through the evacuation conduit 41.

The top wall 52a of the manifold 52 cooperates with an upper, confinement wall 64a of the right-hand confinement wall 64b of the cathode shield 35 to provide a pair of oppositely disposed supporting shelves on which ends of the elongated ceramic magnet assemblies 5o may rest. The magnetically attractive web of substrate material 11, which is of a width greater than the distance separating the top manifold wall 52a and the upper confinement wall 64a is then positioned underneath the "shelves". Because of the attractive force of the magnet assemblies 50, the web of substrate material 11 is urged upwardly so that the opposed longitudinal edges of said substrate abut and seal against the top manifold wall 52a on one side, and the top confinement wall 64a on the other.

The unused process gases and nondeposited plasma flow from the plasma region through a side channel 66 formed between generally upright confinement wall 64b and generally upright cathode supporting wall 68. The central portion of the supporting wall 68 is raised above the surface of the chamber 28 to allow the gases and plasma to flow from the side channel 66 through the cutaway portion of the supporting wall 68 and into the evacuation compartment 72 from which they exit via conduit 41. The evacuation compartment 72 is defined as that area between the r.f. plate 34c, the bottom wall of the deposition chamber 28. the right-hand supporting wall 68 and the inner, upright manifold wall 52b. This relationship of the substrate 11 to the process gas introduction, confinement and evacuation system 72 exposes the entire bottom surface of the web of substrate material 11 for the deposition of semiconductor material thereonto. By exposing the entire bottom deposition surface of the web of substrate material 11, maximum use is made of the surface area available for the production of semiconductor devices.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What we claim is:

1. In an isolated glow discharge deposition chamber adapted for the deposition of semiconductor layers onto a relatively large area substrate, the chamber including: at least one cathode; a substrate spacedly removed from the cathode; a cathode region defined above, below and to the sides of the cathode; means for moving the substrate through the cathode region; means for introducing process gases into the deposition chamber; shield means at least partially surrounding the cathode region; means for energizing the at least one cathode to disassociate the process gases into plasma; and means for withdrawing unused process gases and nondeposited plasma from the cathode region to evacuation means; the improvement comprising, in combination:

said shield means including opposed flanges, the distance between said flanges being greater than the width of the substrate so that the substrate may be urged against the flanges, said shield means adapted to cooperate with the substrate to establish a direct path of travel for the process gases from the introducing means, through the cathode region and to the evacuation means; whereby the substrate travels through the cathode region of the deposition chamber beneath said flanges of said shield means so that the entire transverse width of the substrate is exposed for the deposition of semiconductor material thereunto.

2. Apparatus as in claim 1, wherein the flanges lie in a plane above and substantially parallel to the plane of the substrate passing through the deposition chamber.

3. Apparatus as in claim 2, wherein the deposition chamber further includes attractive means adapted to urge the substrate toward the flanges.

4. Apparatus as in claim 3, wherein the attractive means are a plurality of spaced magnets supported by the flanges.

5. In an isolated glow discharge deposition chamber adapted for the deposition of semiconductor layers onto a relatively large area substrate, the chamber including: at least one cathode; a substrate spacedly removed from the cathode; a cathode region defined above, below and to the sides of the cathode; means for moving the substrate through the cathode region; means for introducing process gases into the deposition chamber; shield means at least partially surrounding the cathode region for inhibiting the free flow of process gases from the cathode region; means for energizing the at least one cathode to disassociate the process gases into plasma; and means for withdrawing unused process gases and nondeposited plasma; the improvement comprising, in combination:

said shield means including opposed flanges, the flanges lying in a plane substantially parallel to the plane of the substrate moving through the chamber;

the deposition chamber further including at least one magnet adapted to urge the substrate toward the flanges; the distance between said flanges being greater than the width of the substrate, whereby the substrate travels through the cathode region of the deposition chamber beneath said flanges of said shield means so that the entire transverse width of the substrate is exposed for the deposition of semiconductor material thereonto.

* * * * *